(12) United States Patent
Anderson et al.

(10) Patent No.: US 7,576,379 B2
(45) Date of Patent: Aug. 18, 2009

(54) FLOATING BODY DYNAMIC RANDOM ACCESS MEMORY WITH ENHANCED SOURCE SIDE CAPACITANCE

(75) Inventors: Brent A. Anderson, Jericho, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/671,184

(22) Filed: Feb. 5, 2007

(65) Prior Publication Data

US 2008/0185646 A1    Aug. 7, 2008

(51) Int. Cl.
*H01L 278/108* (2006.01)

(52) U.S. Cl. .............. 257/296; 257/347; 257/348; 257/353; 257/E27.085

(58) Field of Classification Search .............. 257/296, 257/311, 335, 336, 347, 350, 352, 353, E27.084, 257/E27.085, 348
See application file for complete search history.

(56) References Cited

U.S. PATENT DOCUMENTS

| | | | |
|---|---|---|---|
| 5,773,326 A * | 6/1998 | Gilbert et al. | 438/154 |
| 5,936,277 A * | 8/1999 | Takeuchi | 257/336 |
| 6,110,787 A * | 8/2000 | Chan et al. | 438/300 |
| 6,713,810 B1 | 3/2004 | Bhattacharyya | |
| 6,917,078 B2 | 7/2005 | Bhattacharyya | |
| 6,982,457 B2 | 1/2006 | Bhattacharyya | |
| 7,026,690 B2 | 4/2006 | Bhattacharyya | |
| 7,042,052 B2 | 5/2006 | Bhattacharyya | |
| 7,176,527 B2 * | 2/2007 | Fukuda | 257/347 |
| 2002/0050614 A1 | 5/2002 | Unnikrishnan | |
| 2005/0023613 A1 | 2/2005 | Bhattacharyya | |

OTHER PUBLICATIONS

Okhonin, S., et al., "A Capacitor-Less 1T-DRAM Cell," IEEE Electron Device Letters, vol. 23, No. 2, 2002, pp. 85-87.

* cited by examiner

*Primary Examiner*—A. Sefer
*Assistant Examiner*—Eduardo A Rodela
(74) *Attorney, Agent, or Firm*—Scully, Scott, Murphy & Presser, P.C.; Anthony J. Canale

(57) ABSTRACT

A floating body dynamic random access memory (DRAM) structure has a shallow source (first source portion) and a deep source (second source portion), of which the deep source is thicker. A portion of the floating body extends beneath the shallow source to provide extra capacitance. Optionally, the portion of the floating body beneath the shallow source may be more heavily doped than the depletion zone of the body to further enhance the capacitance. Also, by forming a raised portion of the source without raising the drain, the same implantation energy may be used to dope the raised source and the regular drain. The resulting floating body DRAM structure has an enhanced source to floating body capacitance and stores more charges. Operating margins for write and sense operations are increased and the performance and stability of the floating body DRAM are enhanced.

4 Claims, 3 Drawing Sheets

US 7,576,379 B2

FLOATING BODY DYNAMIC RANDOM ACCESS MEMORY WITH ENHANCED SOURCE SIDE CAPACITANCE

FIELD OF THE INVENTION

The present invention relates to a semiconductor structure, and particularly to a floating body dynamic random access memory with enhanced capacitance on the source side.

BACKGROUND OF THE INVENTION

Floating body dynamic random access memory (DRAM) reduces the size of a DRAM memory element by eliminating a capacitor from a conventional DRAM and storing a charge in the floating body of a partially depleted SOI MOSFET. Despite a relatively small amount of charge that the floating body stores, the effect of the stored charge is magnified by altering the threshold voltage and the on-current of the partially depleted SOI MOSFET in certain operating conditions depend on the amount of charge stored in the floating body.

A basic floating body DRAM structure and its operation, as disclosed by Okhonin et al., "A Capacitor-Less 1T-DRAM Cell," IEEE Electron Device Letters, Vol. 23, No. 2, 2002, pp. 85-87, is herein incorporated by reference. According to Okhonin et al., a compact DRAM design for a floating body DRAM results with a unit cell area of about 4 $F^2$ through elimination of a capacitor. F is the critical dimension, or the minimum printable physical dimension, of the lithography tool used to create the physical patterns for a semiconductor structure.

Operation of an exemplary prior art floating body DRAM is described herein with accompanying figures. Referring to FIG. 1, a prior art floating body DRAM comprises a semiconductor substrate 10, a buried oxide layer 20, a top semiconductor layer 39, a gate dielectric 52, a gate conductor 54, and a spacer 52. The top semiconductor layer 39 contains shallow trench isolation (STI) regions 40, a source 70, a drain 72, a depletion zone 31, and a floating body 32. The depletion zone 31 and the floating body 32 are collectively comprise a "body". Both the depletion zone 31 and the floating body 32 are doped substantially at the same doping level with the same type of dopants, i.e., the body (31,32) is substantially of the same doping level and of the same dopant type. Dopant concentration for the body (31,32) is within the range from $1.0\times 10^{18}/cm^3$ to $5.0\times 10^{19}/cm^3$, and is typically within the range from $5.0\times 10^{18}/cm^3$ to $2.0\times 10^{19}/cm^3$. Both the source 70 and the drain 72 are heavily doped, typically in the concentration range from $1.0\times 10^{20}/cm^3$ to $1.0\times 10^{21}/cm^3$, with dopants of the opposite type relative to the dopants in the body (31,32). The floating body DRAM can be implemented in an SOI PMOSFET or in an SOI NMOSFET. In the case of an SOI NMOSFET, the body 33 is doped with p-type dopants and the source 70 and the drain 72 are doped with n-type dopants. In the case of an SOI PMOSFET, the body (31,32) is doped with n-type dopants and the source 70 and the drain 72 are doped with p-type dopants. The prior art floating body DRAM in FIG. 1 is electrically isolated by the buried oxide layer 20 and by the shallow trench isolation regions 40 from adjacent devices and the substrate 10.

"Writing" of information to be stored, i.e., a "1" or a "0", is performed by turning on the prior art floating body DRAM in FIG. 1, which is an SOI NMOSFET, by applying suitable voltage biases to the gate conductor 54, to the drain 72, and to the source 70. Depending on the combination of voltage conditions on the three terminals, i.e., on the gate conductor 54, on the drain 72, and on the source 70, either positive charges (holes) or negative charges are stored in the floating body 32. During the sensing of the stored information, either the threshold voltage or the on-current of the prior art floating body DRAM is sensed by a sense circuit.

FIGS. 2 and 3 show an implementation of a prior art floating body DRAM in an exemplary array. FIG. 2 is a vertical cross-section of the prior art floating body DRAM array along the plane of A-A' in FIG. 3. FIG. 3 is a schematic top down view of the prior art floating body DRAM array in which only the active area, STI region, contacts, and metal level wiring are shown.

FIGS. 2 and 3 show a unit cell U of the prior art floating body DRAM array. The unit cell U is a physical implementation of a memory element that can store a single binary bit of information. The unit cell U comprises one floating body DRAM, which is a single partially doped SOI MOSFET. As can be seen in FIG. 3, a unit cell U adjoins at least another mirror image unit cell, i.e., a mirror image of the original unit cell U, along the direction of the rows within the array. A unit cell adjoins at least one other replica unit cell, i.e., an identical copy of the original unit cell, along the direction of the columns within the array. The unit cell U comprises a portion of a row of active area 33 which is isolated from neighboring rows of active area 33 by at lease one row of shallow trench isolation (STI) 42.

The prior art floating body DRAM array is formed on an SOI substrate, which comprises a semiconductor substrate 10 and a buried oxide layer 20. Each unit cell U comprises a portion of a row of active area 30, which has a source 70, a body 33, a drain 72, a portion of a gate electrode line 50, a spacer 60, a source silicide 80, a drain silicide 82, a source contact 86, a drain contact 88, a portion of a source M1 line 90, a drain M1 pad 92, a drain V1 via 98 (drawn oversized in FIG. 3 for clarity), and a portion of a drain M2 line 100. The gate electrode line 50 may comprise a gate dielectric 52 and a gate conductor line 54 as shown in FIG. 2. The gate conductor line 54 typically contains a doped gate polysilicon line 55 and a gate silicide line 56. Insulators such as rows of STI 42, a middle-of-the-line (MOL) dielectric 85, and a M1 level dielectric 95 provide electrical isolation among the electrically active components listed above. The source 70 adjoins another source 70 in a neighboring mirror image unit cell. A drain 72 adjoins another drain 72 in another neighboring mirror unit cell. The source silicide 80 adjoins a neighboring source silicide 80. A drain silicide 82 adjoins a neighboring drain silicide 82. The source contact 86 is shared with a neighboring unit cell. The drain contact 88 is also shared with a neighboring unit cell. The aspect of sharing of some of the components with neighboring unit cells is evident in the figures and thus implied in the subsequent discussions of the structures.

The unit cell U is electrically accessed by activating the source M1 line 90, the drain M2 line 100, and the gate conductor line 50 that are electrically connected to the unit cell to be accessed. The other lines may be kept deactivated, that is, not selected for a writing operation or for a sense operation. Alternatively, unit cells in one row, in one column, in a portion of a row, or in a portion of a column may be accessed at the same time by designing the architecture of the array to minimize or eliminate cross-talks, that is, interference between operations of two different unit cells. According to the architecture of the exemplary prior art floating body DRAM array in FIGS. 2 and 3, data can be stored only in the unit cells U within the same row of active area 30 at one time. Similarly, data can be read off the unit cells U within the same column, i.e., the unit cells U that are connected to the same gate conductor line 50 at one time. Alterations in the design of the architecture may allow alternate cell access schemes, While providing advantage in the cell layout by requiring a cell area of only about 4 $F^2$, implementation of floating body DRAM arrays faces challenges due to limitations inherent in the unit cell design. One of the key problems in the implementation of a floating body DRAM is a limited amount of charge that a floating body can store. The data is stored in the form of electrical charges in the floating body, which is sensed by the alterations in the threshold voltage of the SOI MOSFET or, more preferably, by the magnitude of the on-current of the SOI MOSFET. The larger the amount of the stored charge, the greater the change in the sense parameters, e.g., the threshold voltage or the on-current. Typical SOI MOSFET does not hold enough charges in the floating body in low voltage operations, and thus, a high voltage operation, e.g., operating voltage in excess of 2.0V in the examples in Okhonin et al., is necessary, While the capacitance of the source-body junction may be increased by increasing the doping of the body, this results in higher leakage of the SOI device.

Therefore, there exists a need for an improved floating body DRAM structure that enables a lower voltage operation by storing an increased amount of charge in the floating body.

Furthermore, there exists a need to provide a floating body DRAM structure with enhanced capacitance, and consequently, enhanced ability to store charges in the floating body without causing increases in the device leakage.

SUMMARY OF THE INVENTION

The present invention addresses the needs described above by providing a floating body DRAM structure with enhanced capacitance between the source and the floating body.

Specifically, the floating body DRAM structure provided by the present invention is a semiconductor-on-insulator (SO) metal-oxide-semiconductor filed effect transistor (MOSFET) structure having a floating body located under both the gate dielectric and the source.

A semiconductor-on-insulator (SO) metal-oxide-semiconductor filed effect transistor (MOSFET) structure according to the present invention comprises:

a first source portion with a first thickness;

a second source portion with a second thickness, wherein the second thickness is greater than the first thickness; and a first floating body portion located underneath the first source portion and not contacting the first source portion.

The first source portion is shallower than second source portion. Also, the first source portion contacts a gate spacer. The second source portion does not contact the gate spacer. The first floating body portion is underneath the first source portion and is separated from the first source portion by a depletion region. The SOI MOSFET according to the present invention further comprises a second floating body portion, in which the second floating body portion is located under a gate dielectric. The first floating body portion is adjoined to the second floating body portion. Also, the drain of the SOI MOSFET has a third thickness, which is preferably the same as the second thickness.

The SOI MOSFET according to the present invention also comprises a depletion zone in which free mobile charges are not present. Preferably, the depletion zone contacts the gate dielectric, the first source portion, and the second source portion. The second thickness, or the thickness of the second source portion may be the thickness of a top semiconductor layer, which comprise the semiconductor structures above a buried oxide layer and below the level of a gate dielectric. Also, the third thickness, or the thickness of the drain of the SOI MOSFET may be the thickness of the top semiconductor layer. Preferably, both the second thickness and the third thickness are the thickness of the top semiconductor layer.

Both the depletion zone and the second floating body portion preferably have a doping concentration in the range from about $1.0 \times 10^{18}/cm^3$ to about $5.0 \times 10^{19}/cm^3$. The first floating body portion, which is located beneath the first source portion may have substantially the same doping concentration as the second floating body portion. Alternatively, the first floating body portion may have a higher doping concentration than second floating body portion. In this case, the first floating body portion may have a doping concentration in the range from about $5.0 \times 10^{19}/cm^3$ to about $5.0 \times 10^{20}/cm^3$, and preferably in the range from about $1.0 \times 10^{20}/cm^3$ to about $3.0 \times 10^{20}/cm^3$.

For both cases of doping concentration for the second floating body portion, the second thickness, or the thickness of the second source portion, may be the thickness of the top semiconductor layer. Furthermore, the SOI MOSFET structure may further comprise a raised source portion which is epitaxially disposed over the first source portion and over the second source portion.

The SOI MOSFET structure may further comprise a source contact contacting the raised source portion and a drain contact contacting the drain. In this case, preferably, only the source side is raised and the drain side is not raised. As a consequence, a bottom of the source contact is located higher than a bottom of the drain contact.

The SOI MOSFET structure according to the present invention provides enhanced capacitance between the source, which comprises the first source portion and the second source portion and optionally the raised source portion, and the floating body which comprises the first floating body portion and the second floating body portion. The second floating body portion which is located directly on a buried oxide layer and underneath the gate dielectric has substantially the same level of doping as the depletion zone. The depletion zone is contacts the floating body, which includes the first floating body portion and the second floating body portion, on one side and contacts the drain, the gate dielectric, and the source, which comprises the first source portion and the second source portion, on the other side.

Operation of an SOI MOSFET at different operation voltages results in different sizes for the floating body portions. Given an operation voltage, however, the structure of the MOSFET determines the sizes of floating body portions. Therefore, when the sizes for the first floating body portion and the second floating body portion are described in the discussion of the present invention, therefore, predetermined operating voltages are assumed. Despite the changes in the sizes of the first floating body portion and the second floating body portion with operating voltages, the presence of first and second floating body portions is not altered in the SOI MOSFET structure since their presence is an inherent property of an SOI MOSFET according to the present invention.

Source of the drain regions that are filly abutted to the BOX are preferred in order to electrically isolate a unit cell from neighboring unit cells. Presence of a first floating body underneath the first source portion is an aspect of the present invention that the prior art SOI MOSFETs do not provide.

Compared to the SOI MOSFET structure according to the prior art, the SOI MOSFET structure according to the present invention has enhanced capacitance since the area of the capacitor between the floating body and the source is increased. Furthermore, the capacitance between the floating body and the source may be improved further by increasing the doping of the first floating body portion under the first source portion. Optionally, increase in the source resistance may be alleviated by adding a raised source portion to the structure.

DETAILED DESCRIPTION OF THE INVENTION

Figure 4:
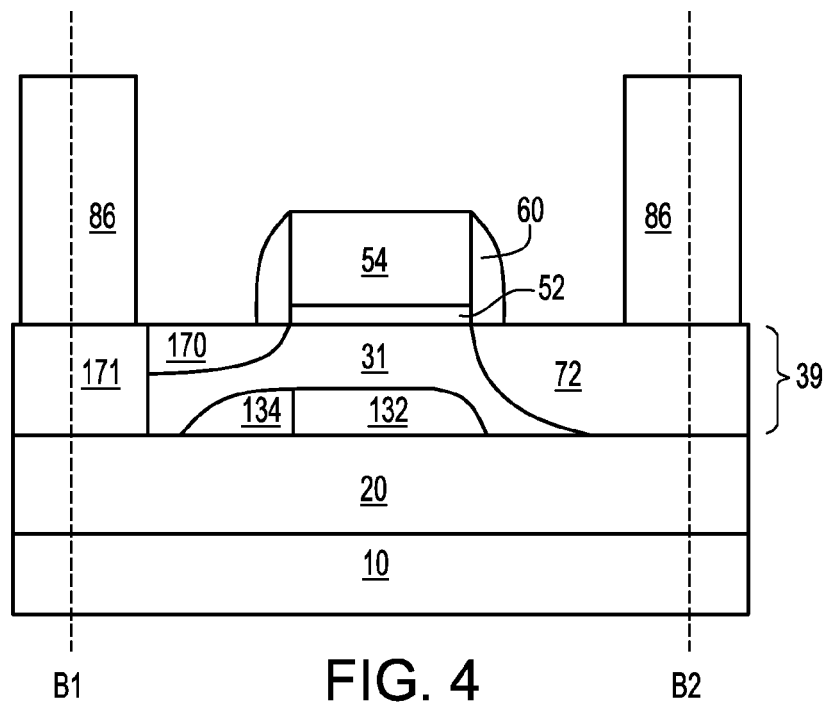
FIG. 4 is a vertical cross-section a unit cell of a floating body DRAM according to the first embodiment of the present invention. Structures up to the contact level are shown.
Figure 5:
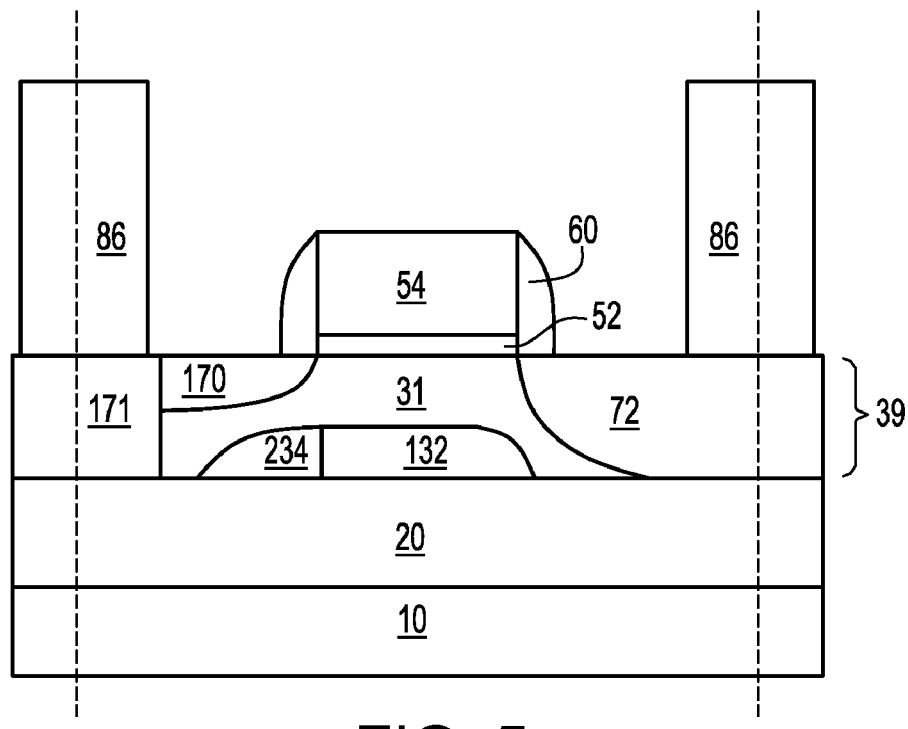
FIG. 5 is a vertical cross-section of a unit cell of a floating body DRAM according to the second embodiment of the present invention. Structures up to the contact level are shown.
Figure 6:
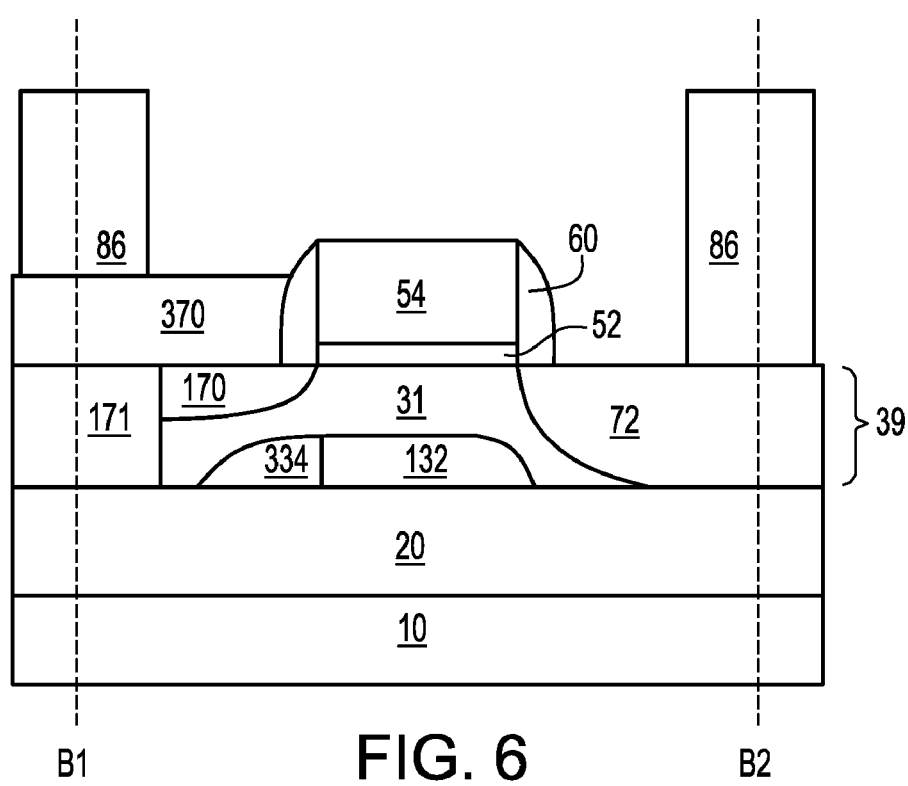
FIG. 6 is a vertical cross-section of a unit cell of a floating body DRAM according to the second embodiment of the present invention. Structures up to the contact level are shown.

FIGS. 4-6 show various embodiments of the present invention. Elements with the same reference numerals across the various figures represent elements that have identical properties across the various embodiments. Equivalence across embodiments between elements with the same reference numerals is assumed.

Referring to FIG. 4, a vertical cross-sectional view of an exemplary unit cell for a floating body DRAM structure, which is an SOI MOSFET, according to the present invention is shown. The unit cell is shown only up to the contact level without an MOL dielectric or an M1 level dielectric, However, the unit cell according to the present invention may employ the same wiring scheme as was used in the prior art shown in FIGS. 2 and 3. Therefore, the present invention utilizes the same circuit wiring scheme according to the prior art or alternately, any other compatible wiring scheme for accessing each unit cell.

The unit cell according to the present invention in FIG. 4 comprises a gate dielectric 52, a gate electrode 54 which forms a gate electrode line when adjoined with neighboring gate electrodes 54, a spacer 60, a source which comprises a first source portion 170 and a second source portion 171, a drain 72, and a body. The body comprises a depletion zone 31 and a floating body. The floating body comprises a first floating body portion 134 and a second floating body portion 132. The first floating body portion 134 is located under the first source portion 170 and the second floating body portion 132 is located under the gate dielectric 52. The source (170, 171), the drain 72, the body (31, 132, 134) as well as rows of STI (not shown in FIG. 4 but is similar to the rows of STI 42 in FIG. 3) comprise a top semiconductor layer 39. The unit cell is located on a buried oxide layer 20, which is located on a semiconductor substrate 10.

Both the left side boundary B1 and the right side boundary B2 of the unit cell according to the present invention are shown in FIG. 4. A unit cell according to the present invention adjoins a mirror image unit cell on each side, that is, both on the side of the source and on the right side of the drain in FIG. 4. A source contact 86 is shared with an adjoining mirror image cell. A drain contact 88 is shared with another adjoining mirror image cell. The second source portion 171 adjoins the mirror image cell that shares the source contact 86. The drain 72 adjoins the mirror image cell that shares the drain contact 88.

The first source portion 170 has a first thickness, which connotes the thickness of the thickest portion of the first source portion 170. The second source portion 171 has a second thickness, which connotes the thickness of the thickest portion of the second source portion 171. Similarly, the drain 72 has a third thickness, which connotes the thickness of the thickest portion of the drain 72.

According to the present invention, the first thickness is less than the second thickness. The second thickness may be less than or equal to, and is preferably equal to, the thickness of the top semiconductor layer 39. The third thickness may be less than or equal to, and is preferably equal to, the thickness of the top semiconductor layer 39.

Preferably, the thickness of the second source portion 171 equals the thickness of the top semiconductor layer 39, i.e., the SOI MOSFET in the unit cell source is filly abutted to the BOX to prevent a cross-talk between a unit cell and the neighboring mirror unit cells adjoining the second source portion 171. The neighboring mirror unit cell shares the source contact 86.

Preferably, the thickness of the drain 72 equals the thickness of the top semiconductor layer 39, i.e., the SOI MOSFET in the unit cell drain is fully abutted to the BOX to prevent a cross-talk between a unit cell and the neighboring mirror unit cells adjoining the drain 72. This neighboring mirror unit cell shares the drain contact 88.

The doping concentration of the depletion zone 31 and the second source portion 132 have a normal level of body doping as prior-art SOI MOSFETs. For example, the depletion zone 31 and the second floating body portion 132 may have a doping concentration in the range from about $1.0 \times 10^{18}/cm^3$ to about $5.0 \times 10^{19}/cm^3$. In an n-type SOI MOSFET, the doping is of p-type. In a p-type SOI MOSFET, the doping concentration is of n-type.

According to the first embodiment of the present invention, the first floating body portion 134, which is located beneath the first source portion 170, has substantially the same doping concentration as the second floating body portion 132 and is of the same doping type. The floating body comprises the first floating body portion 134 and the second floating body portion 132. Both the floating body (132, 134) and the depletion zone 31 have substantially the same doping. The SOT MOSFET according to the first embodiment of the present invention has an enhanced capacitance between the floating body (132, 134) and the source (170, 171) compared to a prior art SOI MOSFET, which does not have a volume that corresponds to the first floating body region 134 but has comparable dimensions otherwise. The structure of the first embodiment has more area for the combined surfaces of the first source portion 170 and the second source portion 171 that adjoins the depletion zone 31. Also, the surface area of the floating body (132, 134) is more than the surface area of a prior art SOI MOSFET with comparable dimensions otherwise. The enhancement of capacitance in the SOI MOSFET structure according to the first embodiment of the present invention is due to the increased areas of the floating body (132, 134) and of the source (170, 171).

Figure 1:
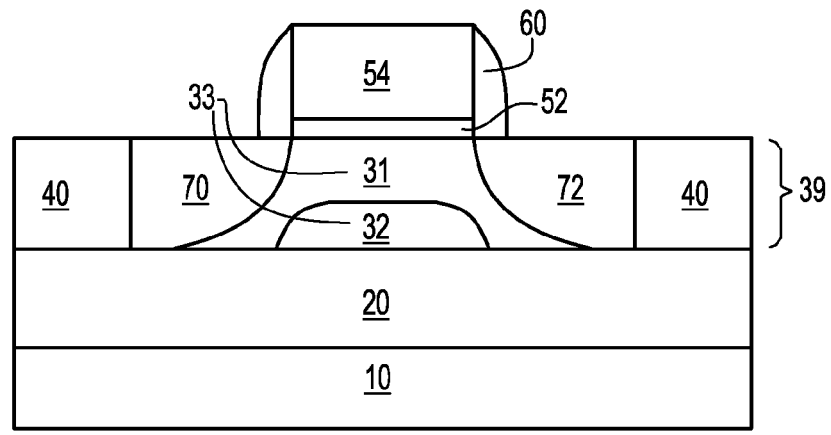
FIG. 1 is an exemplary prior art floating body DRAM.
Figure 2:
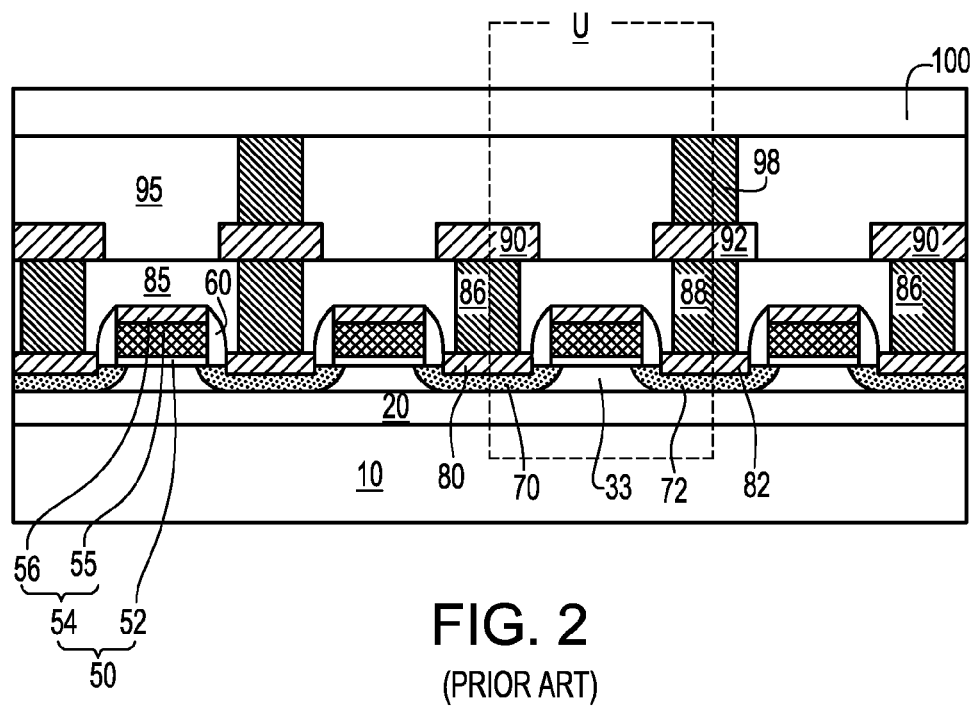
FIG. 2 is a vertical cross-section of an exemplary prior art floating body DRAM array formed out of a prior art unit cell U. The cross-section for FIG. 2 is taken along the plane A-A' in FIG. 3.
Figure 3:
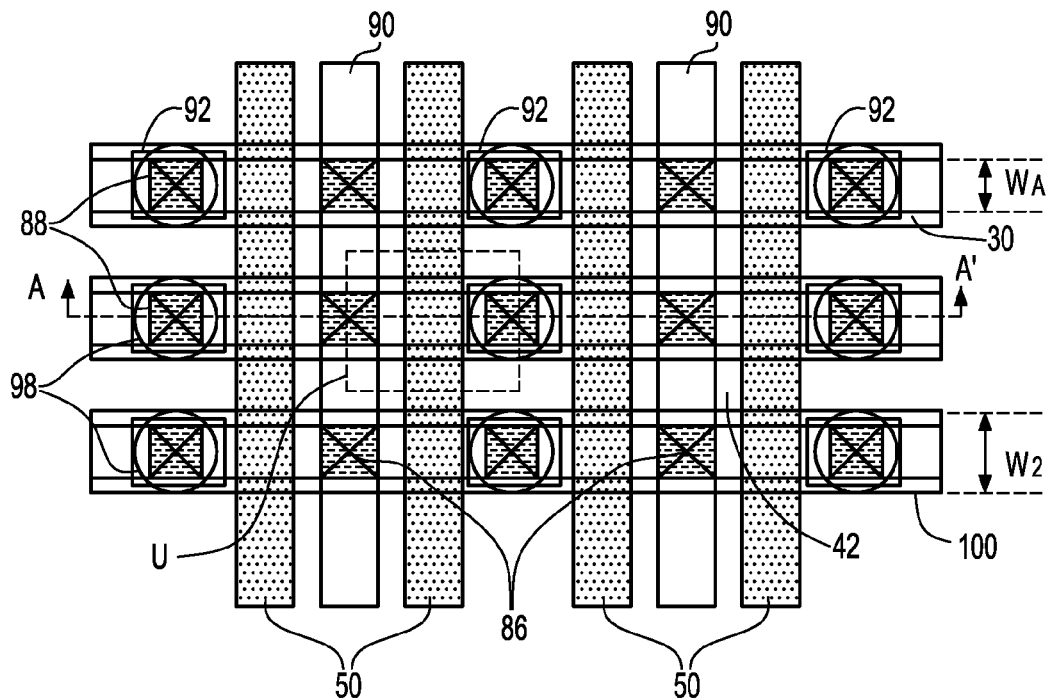
FIG. 3 is a schematic top down view of the exemplary prior art floating body DRAM array formed out of the prior art unit cell U that is shown in FIG. 2. Spacers, MOL dielectric, and M1 level dielectric are not shown for clarity.

Compared to the exemplary prior art SOI MOSFET in FIGS. 2 and 3, the SOI MOSFET according to the first embodiment of the present invention utilizes an additional implantation step of shallow source implant, or the implantation into the first source portion 170. Preferably, a first implant mask is formed over the first source portion 170 of the SOI MOSFET according to the first embodiment of the present invention. The source and drain implants are performed to dope the second source portion 171 and the drain 72 while the first implant mask blocks any implantation into the first source portion 170. The first implant mask is thereafter removed and a shallow source implant is performed to form the first source portion 170. The energy of the shallow source implant is chosen such that the first thickness is less than the second thickness. The shallow source implant is preferably a blanket implant without a mask.

Referring to FIG. 5, a second embodiment of the present invention is shown. The floating body according to the second embodiment of the present invention comprises a first floating body portion 234 and a second floating body portion 132. The first floating body portion 234 is located under a first source portion 170 and the second floating body portion 132 is located under a gate dielectric 52. The first floating body portion 234 according to the second embodiment has a higher doping concentration than second floating body portion 132. Preferably, the first floating body portion 234 has a doping concentration in the range from about $5.0\times10^{19}/cm^3$ to about $5.0\times10^{20}/cm^3$, and preferably in the range from about $1.0\times10^{20}/cm^3$ to about $3.0\times10^{20}/cm^3$. The SOI MOSFET according to the second embodiment of the present invention has an enhanced capacitance between the floating body (132, 234) and the source (170, 171) not only due to the increased areas of the floating body (132, 234) and of the source (170, 171) but also by the increased doping concentration of the second floating body portion 234 that enables more charges to be held therein.

According to the second embodiment of the present invention, the same first implant mask as in the first embodiment is preferably used to form the second source portion 171, the drain 72, and the first source portion 170. The conditions for the use of the first implant mask according to the second embodiment are the same as those according to the first embodiment. Preferably, an additional second mask is used to mask the second source portion 171 and preferably the drain 72 as well as before implanting dopants into the first floating body portion 234. Since the first floating body 234 has the opposite doping type to that of the source (170, 171) and the drain 72, the second source portion 171 and the drain 72 can be masked during the implantation of the first floating body portion 234. Alternatively, the implantation of the first floating body 234 region may be blocked only over the gate, possibly using the gate electrode itself as the blocking mask.

Referring to FIG. 6, a third embodiment of the present invention is shown. The first floating body portion 334 according to the third embodiment of the present invention may be identical to the first floating body portion 134 according to the first embodiment or alternatively, may be identical to the first floating body portion 234 according to the second embodiment. According to the third embodiment of the present invention, a raised source portion 370 is formed directly on and over the first source portion 170 and the second source portion 171. Preferably, the raised source portion 370 is formed by selective epitaxy of a semiconductor material, in one alternative using the same semiconductor material as the first source portion 170 or the second source portion 171, or using alloys (such as Carbon in a silicon epitaxy). Most preferably, the semiconductor material for the first source portion 170, the second source portion 171, and the raised source portion 370 are identical.

Preferably, additional semiconductor material is not deposited on the drain 72 of the SOI MOSFET according to the third embodiment of the present invention. The method of manufacture for the structure according to the third embodiment of the present invention, for example, may include the following steps in addition to the steps according to the first or second embodiments.

forming and lithographically patterning a dielectric masking layer to expose surfaces of the first source portion 170 and the surfaces of the second source portion 171;

selectively depositing a semiconductor material on the first source portion 170 and on the second source portion 171;

optionally removing the dielectric masking layer; and implanting dopants into the drain 72, the first source portion 170, and optionally and preferably, to an upper portion of the second source portion 171.

The structure according to the third embodiment of the present invention provides lower source resistance in addition to the benefits of the first or second embodiment of the present invention.

A first implant mask may be used according to the third embodiment of the present invention as in the first embodiment Also, a second implant mask may be used according to the third embodiment of the present invention as in the second embodiment. The doping of the raised source portion 370 however does not require an additional mask. The height of the raised source portion 370 is controlled such that the same implant ion species and the implant energy can be used for the implantation of the raised source portion 370 and of the drain 72, and optionally of the first source portion 170 and an upper portion of the second source portion 171.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A semiconductor-on-insulator (SOI) metal-oxide-semiconductor field effect transistor (MOSFET) structure comprising:

a first source portion with a first thickness;

a second source portion with a second thickness, wherein said second thickness is greater than said first thickness; and a first floating body portion located underneath said first source portion and not contacting said first source portion;

a second floating body portion, wherein said second floating body portion is located under a gate dielectric;

a drain having a third thickness, wherein said second thickness and said third thickness are the same;

a depletion zone contacting said gate dielectric, said first source portion, said second source portion, and said drain;

a raised source portion that is epitaxially disposed over said first source portion and said second source portion;

a source contact contacting said raised source portion;

a drain contact contacting said drain, wherein a bottom of said source contact is located higher than a bottom of said drain contact, wherein said depletion zone and said second floating body portion has a doping concentration in the range from about $1.0\times10^{18}/cm^3$ to about $5.0\times10^{19}/cm^3$, and wherein said first floating body portion has a substantially the same doping concentration as said floating body portion.

2. The SOI MOSFET structure of claim 1, wherein said second thickness is the thickness of a top semiconductor layer.

3. A semiconductor-on-insulator (SOI) metal-oxide-semiconductor field effect transistor (MOSFET) structure comprising:

a first source portion with a first thickness;

a second source portion with a second thickness, wherein said second thickness is greater than said first thickness; and a first floating body portion located underneath said first source portion and not contacting said first source portion;

a second floating body portion, wherein said second floating body portion is located under a gate dielectric;

a drain having a third thickness, wherein said second thickness and said third thickness are the same;

a depletion zone contacting said gate dielectric, said first source portion, said second source portion, and said drain;

a raised source portion that is epitaxially disposed over said first source portion and said second source portion;

a source contact contacting said raised portion of said source; and a drain contact contacting said drain, wherein a bottom of said source contact is located higher than a bottom of said drain contact, wherein said first floating body portion has a doping concentration in the range from about $5.0 \times 10^{19}/cm^3$ to about $5.0 \times 10^{20}/cm^3$, and wherein said first floating body portion has a doping concentration in the range from about $1.0 \times 19^{20}/cm^3$ to about $3.0 \times 10^{20}/cm^3$.

4. The SOI MOSFET structure of claim 3, wherein said second thickness is the thickness of a top semiconductor layer.

* * * * *